United States Patent [19]

Du Bois

[11] 4,241,497
[45] Dec. 30, 1980

[54] P.C. BOARD LEAD TRIMMING METHOD

[75] Inventor: Edward F. Du Bois, Binghamton, N.Y.

[73] Assignee: The Singer Company, Binghamton, N.Y.

[21] Appl. No.: 2,507

[22] Filed: Jan. 11, 1979

Related U.S. Application Data

[60] Continuation-in-part of Ser. No. 864,163, Dec. 27, 1977, abandoned, which is a continuation of Ser. No. 649,309, Jan. 15, 1976, abandoned, which is a division of Ser. No. 580,816, May 27, 1975, abandoned.

[51] Int. Cl.³ .............................................. H05K 3/22
[52] U.S. Cl. ............................. 29/839; 51/328; 51/143
[58] Field of Search ................. 29/837, 838, 839; 300/17; 51/165, 231, 281 R, 137, 142, 143, 147, 243, 328, DIG. 17

[56] References Cited

U.S. PATENT DOCUMENTS

| | | |
|---|---|---|
| 2,486,108 | 10/1949 | Brunel ............................ 51/231 X |
| 2,669,075 | 2/1954 | Dreyfus ........................... 300/17 X |
| 2,706,873 | 4/1955 | Gifford ............................... 51/137 |
| 2,710,500 | 6/1955 | Bolger ............................... 51/142 |
| 3,063,204 | 11/1962 | Baumgartner ................ 51/281 R X |
| 3,237,282 | 3/1966 | Rieth ................................ 29/838 X |
| 3,271,909 | 9/1966 | Rutt .................................. 51/138 X |
| 3,466,732 | 9/1969 | Taylor ................................. 29/839 |
| 3,593,464 | 7/1971 | Bell ................................... 51/143 |
| 4,127,692 | 11/1978 | Boynton ............................ 29/839 |

*Primary Examiner*—Gary L. Smith
*Attorney, Agent, or Firm*—J. Dennis Moore; Jeff Rothenberg

[57] ABSTRACT

A method and apparatus for trimming soldered printed circuit board component leads to a uniform finished height. The leads are pre-trimmed prior to soldering to an intermediate length long enough such that when inserted into the board the leads will possess a desired degree of mechanical security, while short enough to permit even abrasive trimming. A driven abrasive surface is passed across the soldered leads and the leads are then trimmed to a uniform finished height.

5 Claims, 6 Drawing Figures

P.C. BOARD LEAD TRIMMING METHOD

This application is a continuation-in-part of parent application Ser. No. 864,163 filed on Dec. 27, 1977, now abandoned, which was a continuation of application Ser. No. 649,309 filed on Jan. 15, 1976, now abandoned which was, in turn, a division of application Ser. No. 580,816 filed on May 27, 1975, now abandoned.

BACKGROUND OF THE INVENTION

1. Field of the Invention

The invention finds application in areas of printed circuit manufacture and more particularly to component lead trimming operations.

2. Description of Prior Art

In general, printed circuit assembly operations comprise the steps of component selection, component lead forming and trimming, mounting components on printed circuit boards (p.c. boards), soldering the components to the p.c. boards, trimming the soldered lead to a finished height, and testing operation of the finished assembly.

Two trimming operations may be noted, both of which involve cutting the leads to a desired length. The first takes place at the time the component leads are formed for ready insertion in the p.c. board, and may be done mechanically on a machine designed specifically for this function. The purpose of this initial cutting step is to prevent the bottom of the assembled board from becoming a tangle of long leads which would, e.g., prevent the board from being placed in the soldering bath conveyer, and which would collect an excessive amount of solder even if it could. The second trimming operation occurs after the components are soldered in place, and typically must be done by hand, which is costly.

Attempts have been made to reduce these two trimming operations to one by cutting the component leads to their final finished dimension at the time the leads are formed, thus eliminating the costly, manual cutting operation. However, when this is done the unsoldered components tend to become easily displaced from the board for lack of support, and the resulting unsoldered assembly therefore becomes unwieldy and difficult to handle.

For example, typical allowable final lead specifications call for a protrusion of the lead of approximately 50 to 60 mils from the bottom of the board. If component leads are cut to such tolerances, the component becomes top-heavy and, consequently, mechanically unstable in the board before soldering. A slight jar of the unsoldered board is sufficient to knock the component out of place. Also, with the leads so short, it is impossible to spaly them sufficiently once inserted so as to fasten them to the board. Further, even if the board is carefully placed in the soldering bath conveyor intact, the short leads tend to "float" on the molten solder. That is, the surface tension of the solder tends to push the component leads up and back through their respective lead holes. Therefore, if the leads are pre-cut to the final length in this manner, extra precautions must be taken to maintain the loose components in place until the soldering operation is complete. Such extra care is costly and time consuming.

To avoid the second trimming operation some manufacturers leave the leads long enough to avoid the above-noted problems, and resort to a clinching operation whereby the overly long component leads are folded back against the p.c. board. This provides mechanical support, but is a costly alternative and lacks a craftsman-like appearance.

As suggested above, final cutting operation is typically a manual operation, wherein an operator examines the lead lengths relative to a Manufacturing Specification and clips the leads accordingly using a hand-held plier type cutting tool known in the industry as "side cutters". Quality Control visually inspects the finished product and rejects the board with too long lead lengths. Rejection for too short a lead length also often results from these manual operations since operators often respond to the syndrome which leads a man to produce a stool from what was originally a chair which had one leg slightly shorter than the others. The printed circuit foil is often damaged by such manual cutting procedures leading to rejections and rework of the board.

It is an object of the present invention to eliminate manual trimming of leads; to produce an automated, economic, high capacity lead trimming operation; to avoid the faults of prior art techniques; and to produce a high quality finished printed circuit assembly.

SUMMARY OF THE INVENTION

The invention is a method of trimming p.c. board component leads, and an automated lead trimmer apparatus especially adapted to perform that method. The apparatus comprises a printed circuit board carrier, which may be on guide rods, and which is drawn e.g., by an air actuated piston rod, beneath an abrasive surface, such as a commercial grade belt sander, so as to abrasively trim leads on the wiring side of the printed circuit assembly to a fixed length. The printed circuit board carrier is also movable in a direction transverse to the direction of its travel during the trim cycle, so as to accomodate a second cut across printed circuit boards wider than the working surface of the belt sander.

In the practice of the method, the component leads are pre-trimmed to a length long enough to provide mechanical security in the board before soldering, while short enough to permit abrading the leads without their being bent over by the abrasive means and thus causing the formation of slivers at the end of the trimmed leads. A driven abrasive surface is passed across the foil side of the soldered board assembly in a direction parallel to the face of the board at a predetermined minimum separation. The leads are thereby abrasively trimmed to a desired height quickly, efficiently, and with a uniformity that imparts a professional, craftsmanlike appearance to the finished assembly. The method lends itself to performance in an especially adapted machine such as the apparatus of the present invention, thus allowing for a significantly lower cost of p.c. board manufacture.

DESCRIPTION OF THE PREFERRED EMBODIMENT

The invention differs from prior art devices in that the excess component-lead length is removed by abrasion rather than by conventonal clipping/cutting operations. The concept was repeatedly rejected by practitioners of the printed circuit art when disclosed to them by the Applicant, because they feared the p.c. assemblies would be contaminated by the abrasive grit and metallic residues. Practice of the teachings herein have refuted these fears.

Figure 1:
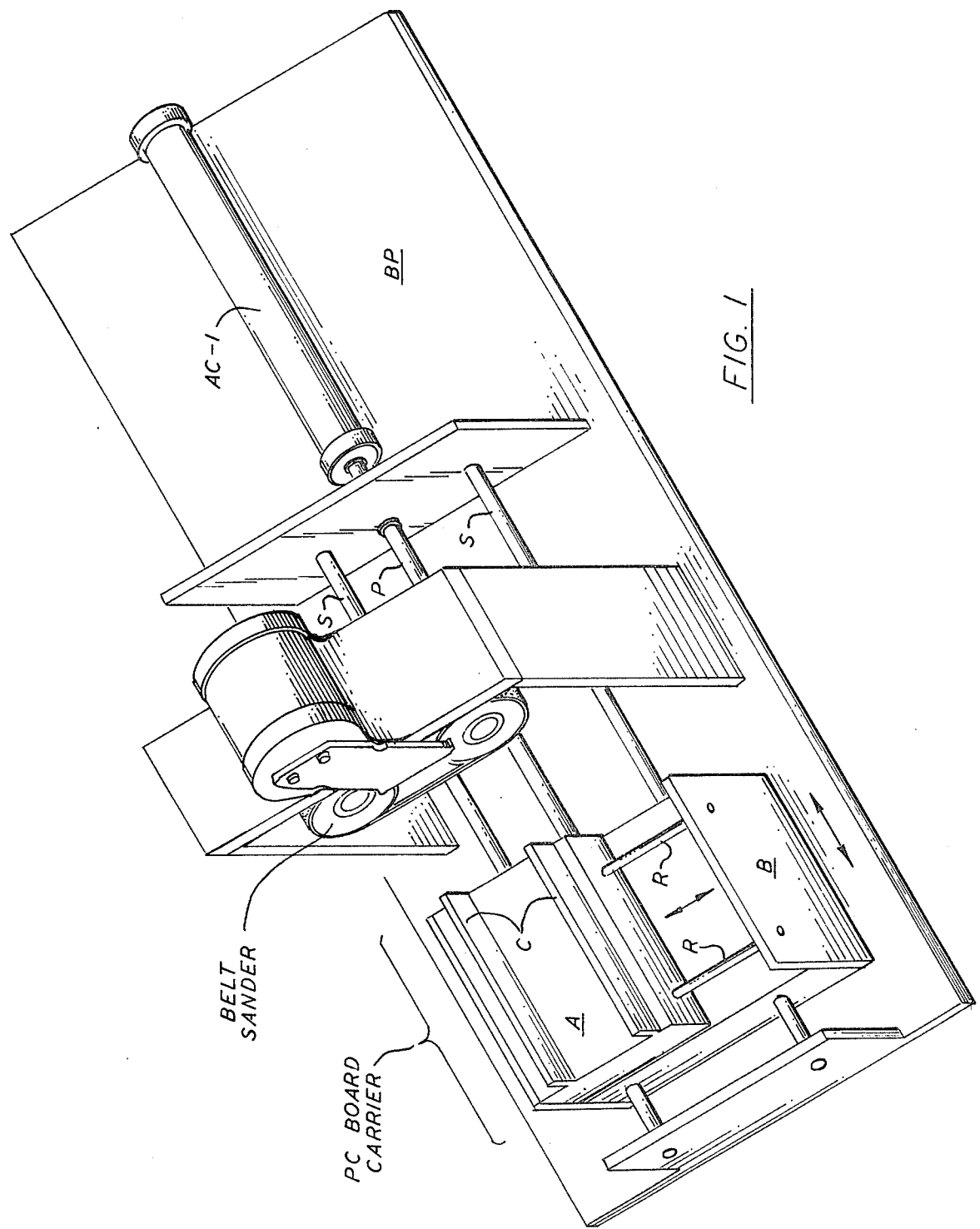
FIG. 1 is an orthogonal view of the preferred embodiment of the present invention.

FIG. 1 illustrates the preferred embodiment of the apparatus of the present invention and indicates the arrangement of the major operating parts. The p.c. board carrier is comprised of two sections. Section A is provided with adjustable clamping bars C to peripherally secure various sized p.c. boards. An air actuated piston, not shown, causes section A to move on slide rods R so that the p.c. board may be positioned to either side of section B. Section B carries section A with the p.c. board mounted thereon. Actuation of air cylinder AC1 causes piston rod P to retract into cylinder AC1 thereby advancing both sections A & B of the p.c. board carrier down the length of base plate BP along slides S.

A belt sander is positioned, and its height adjusted, so that the untrimmed leads of the p.c. board assembly will be intercepted and cut to a predetermined height above the base of the p.c. board as the p.c. board carrier passes beneath the sander.

In practice the sander is preferably canted at an angular setting of approximately 4 degrees to the direction of travel of the p.c. board carrier. This slight cant allows the lead trimmer to operate smoothly without hanging-up on leads which may have been pre-cut slightly long, while trimming all leads to the proper dimension. The particular angle selected is not critical to successful operation of the invention, although too great an angle, e.g., 60 degrees, causes the face of the sander to be presented at too great an angle to smoothly trim the leads by passing them across the major part of the face of the sander, as is desired.

Figure 2:
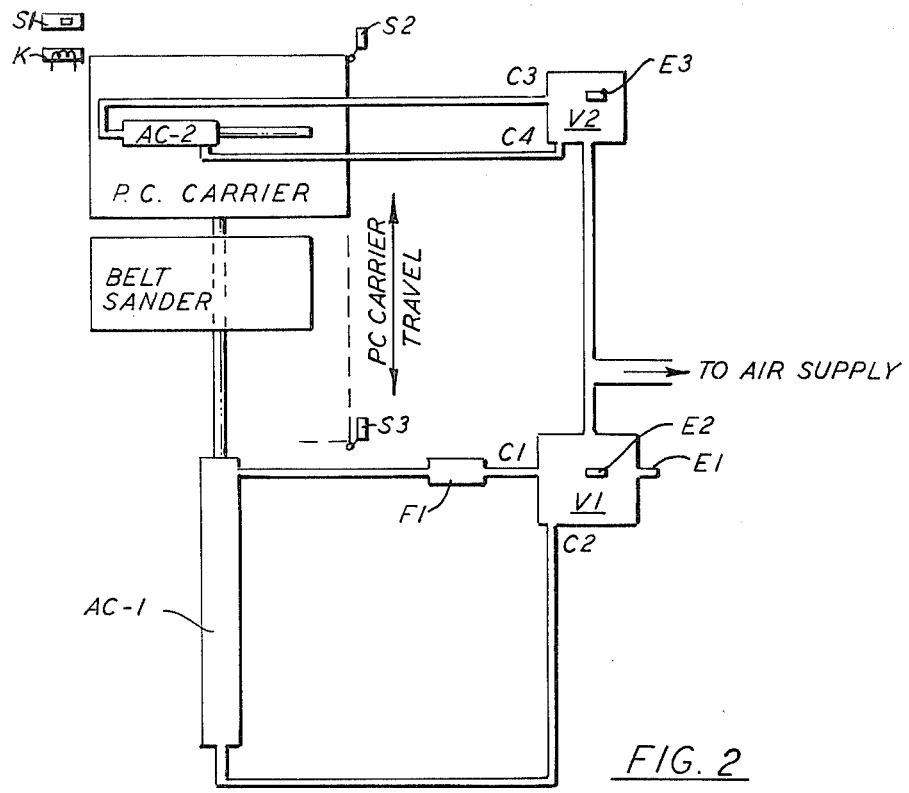
FIG. 2 is a mechanical schematic of the preferred embodiment of the apparatus of the present invention.
Figure 3:
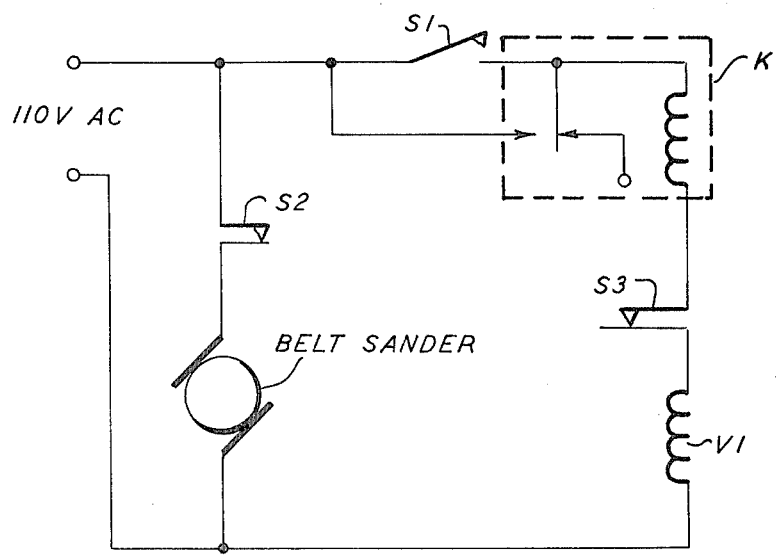
FIG. 3 is an electrical schematic of the preferred embodiment of the apparatus of the present invention.

FIG. 2 is a mechanical schematic which should be studied in conjunction with the electrical schematic of FIG. 3 for a full understanding of the operation of the invention.

A printed circuit assembly whose leads are to be trimmed is secured in the p.c. board carrier. Momentary Switch S1 is depressed which actuates relay K. Relay K may be a conventioanl relay connected in a holding configuration as shown, or a commercial latching relay. With relay K actuated, the four-way solenoid valve V1 is energized, reversing the direction of air flow to air cylinder AC-1.

Prior to depressing switch S1 solenoid valve B1 is configured such that air pressure at output port C2 causes the piston rod of cylinder AC-1 to be extended so as to maintain the PC board carrier in its normal rest position. When V1 is energized by depressing S1, port C2 closes and port C1 opens causing the piston rod of cylinder AC-1 to be displaced down into the cylinder thereby transporting the p.c. board carrier beneath the abrading surface of the belt sander.

The belt sander is energized through micro-switch S2. S2 is a normally closed switch which is held open when the p.c. board carrier is in its normal rest position. As the carrier is transported from its initial rest position, S2 closes and the belt sander is actuated.

Switch S3 is a normally closed microswitch which is actuated mechanically to open when the p.c. board carrier reaches a predetermined limit of travel. The opening of switch S3 both releases relay K and deenergizes solenoid valve V1. Air flow through cylinder AC-1 is now reversed and the piston rod is forced from the cylinder, returning the p.c. board carrier to its initial rest position. As the carrier returns to the position, S2 opens and the belt sander is deenergized.

Ports E1 and E2 on solenoid vlave V1 are relief ports to exhaust the air displaced as the piston moves within the cylinder AC-1.

Flow control valve F1 is provided in the air lines between solenoid valve V1 and air cylinder AC-1. Control valve F1 allows a uniform and adjustable rate of travel of the carrier past the belt sander.

As noted in the discussion of FIG. 1, the p.c. board carrier is made up of two sections, A & B. This construction, in conjunction with air cylinder AC-2 and three-way, manually operated valve V2 allow the p.c. board to be shifted from one side to the other so as to allow a wider board assembly to be processed in two passes under the belt sander if the sander's working surface is inadequate to trim all leads in one pass.

As can be seen, the trimming operation is fully automatic. After a p.c. board assembly has passed through the soldering operation, an operator inserts the board in the clamping bars, C. These may be spring loaded to facilitate insertion and removal of the boards. The operator depresses start switch, S1 and the carrier advances the board; the sander is energized, the leads are trimmed; the carrier returns the board; and the sander is deenergized.

Figure 4A:
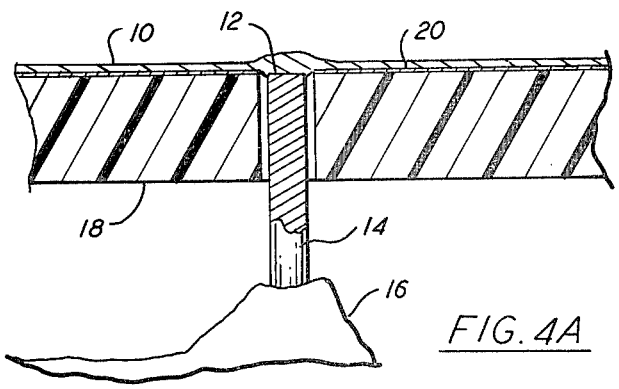
FIGS. 4A, 4B and 4C are close-up cross sectional views of solder joints.
Figure 4B:
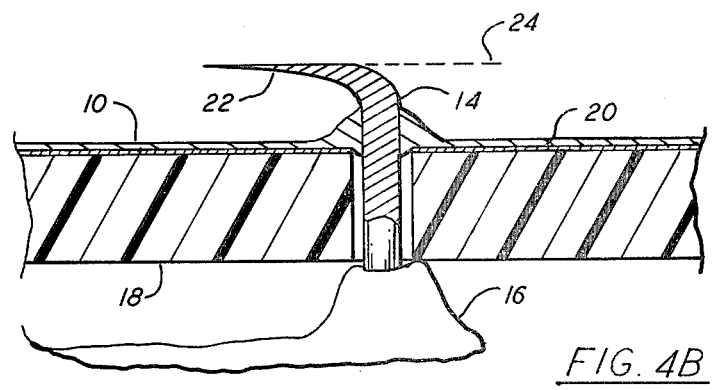
Figure 4C:
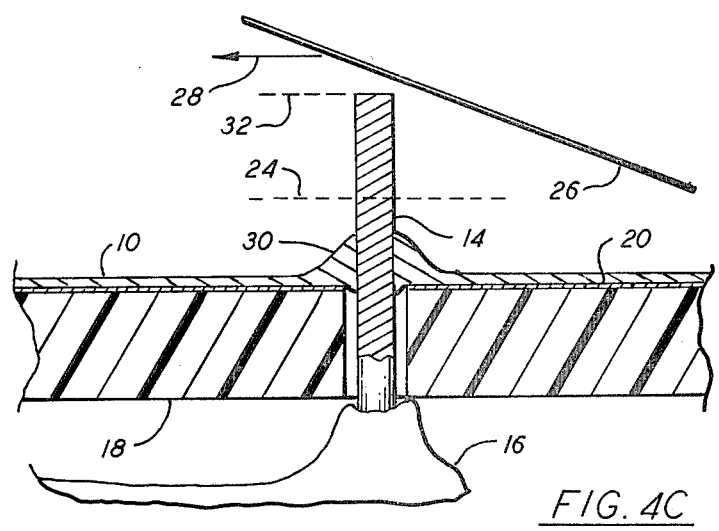

In practicing the method of the present invention, whether with or without the above-described especially adapted apparatus, it has been discovered that an important step must be taken in the pre-insertion trimming operation. Reference should be had to FIGS. 4A, 4B and 4C for an understanding of the following discussion. Each figure depicts a close-up cross sectional view of a solder joint, as will be more fully discussed below.

As was mentioned earlier, if the component leads are pre-trimmed to their final length, one undesirable consequence is that in the soldering operation the lead is forced up back through the board by the surface tension of the solder. The resulting soldered joint, shown in FIG. 4A, is weak, bonding to the solder 10 occurring only at the tip 12 of the lead 14. Also, as can be seen, the component 16 is forced up off the board 18, which is unacceptable. Note that 20 refers to the p.c. board foil.

If, on the other hand, the lead 14 is pretrimmed to too long a length, in addition to causing the undesirable consequences noted earlier, namely that the board may be too bulky to fit onto the soldering bath conveyer, and that excessive solder collection occurs, an additional unacceptable consequence arises if the board is subsequently abrasively trimmed according to the method of the present invention. When the abrasive surface is passed across the over-long lead, the lead is deflected back, away from the on-coming surface. The abrasive surface abrades the bent lead and, referring now to FIG. 4B, leaves a long, sharp sliver 22 at the height of the lowest point of the abrasive surface, depicted by dashed line 24. This is also unacceptable.

It is thus necessary according to the method of the present invention to pretrim the component lead to a length which is not so long as to be deflected back by the on-coming abrasive surface, but is rather short enough to stand with sufficient rigidity against the oncoming sander surface to be abraded evenly from the tip down. FIG. 4C depicts a lead 14 pretrimmed to the proper length, which has been soldered into place, and its relation to the on-coming abrasive surface 26 moving in a direction indicated by arrow 28.

As was stated earlier, typical final lead height specifications are approximately 50 to 60 mils, which would correspond in FIGS. 4B and 4C to the distance of line 24 from the top of foil 20. For such a specification, the preferred pre-trimmed lead height, indicated by dashed line 32 in FIG. 4C, is approximately 120 mils, roughly ⅛th inch. Note that the solder tends to "bead" at the base of the soldered joint 30, which contributes to the lead rigidity.

Despite the fact that practitioners of the printed circuit arts initially vociferously rejected the idea, no adverse effects have been noted from the fact that the leads are reduced by an abrading operation performed according to the present invention, rather than from a clipping/cutting procedure as advocated by prior art. Use of a non-automated, fully manually operated prototype of the apparatus of the present invention in a small printed circuit facility resulted in a time saving of 10-12 man hours per day. Use of the automated device has resulted in a 10-15 percent increase in production and virtually eliminated touch up operations inherent with prior art procedures.

While there have been described what is at present considered to be a preferred embodiment of this invention, it will be obvious to those skilled in the art that various changes and modifications may be made therein without departing from the invention. For example, in practicing the method, the abrasive surface, while being herein depicted as a planar surface, may be a cylindrical surface, or such other surface as presents a linear abrasive element to be component leads. It is therefore intended to cover herein all such changes and modifications as fall within the true spirit and scope of the invention.

What I claim is:

1. In a printed circuit manufacture process wherein leads of electronic components are inserted into appropriate holes in a printed circuit board and soldered to the foil on the underside of the board, a method of trimming the soldered component leads to a desired uniform length, comprising:

(a) cutting the component leads to a predetermined length prior to soldering, such that when fully inserted into the appropriate holes of the board the leads protrude from the foil side of the board a distance which is longer than the desired uniform length, but is shorter than a length which would result in the leads being deflected back by an oncoming driven abrasive surface;

(b) providing an abrasive means having a driveable abrasive surface;

(c) producing relative motion between the soldered printed circuit board and said abrading means to bring the leads into contact with said abrasive surface while maintaining a predetermined minimum separation between the board and said surface equal to the desired uniform length; and (d) driving said abrasive surface to abrasively trim said leads, whereby the leads are quickly and accurately trimmed to the desired uniform length.

2. The method of claim 1 wherein the step of cutting the component leads is performed by cutting the component leads to a length such that, when fully inserted into the board the leads protrude approximately ⅛" from the foil side of the board.

3. The method of claim 1 wherein said abrasive surface includes a planar working surface, wherein the step of providing an abrasive means is performed by providing said abrasive surface at a predetermined angle with respect to the foil side of the board, and wherein the step of producing relative motion comprises the step of displacing said printed circuit board in a direction parallel to the plane of the foil side of the board, whereby the protruding leads are thereby caused to pass across a substantial portion of said surface in abrasive contact therewith, and are thus gradually and evenly abraded down to the desired uniform height.

4. The method of claim 3 wherein the step of driving said abrasive surface is performed by displacing said working surface in a direction transverse to the board's direction of travel.

5. The method of claim 4 wherein the transporting of the printed circuit board and driving of the abrasive surface are automatically and sequentially controlled.

* * * * *